United States Patent [19]

Conzelmann et al.

[11] Patent Number: 4,829,360
[45] Date of Patent: May 9, 1989

[54] MONOLITHIC INTEGRATED SEMICONDUCTOR MEANS TO REDUCE POWER DISSIPATION OF A PARASITIC TRANSISTOR

[75] Inventors: Gerhard Conzelmann, Leinfelden-Echterdingen; Karl Nagel, Gomaringen, both of Fed. Rep. of Germany

[73] Assignee: Robert Bosch GmbH, Stuttgart, Fed. Rep. of Germany

[21] Appl. No.: 50,295

[22] PCT Filed: Aug. 22, 1986

[86] PCT No.: PCT/DE86/00331
§ 371 Date: May 5, 1987
§ 102(e) Date: May 5, 1987

[87] PCT Pub. No.: WO87/01868
PCT Pub. Date: Mar. 26, 1987

[30] Foreign Application Priority Data

Sep. 11, 1985 [DE] Fed. Rep. of Germany ....... 3532381

[51] Int. Cl.⁴ .................... H01L 27/02; H01L 29/48
[52] U.S. Cl. ........................................ 357/46; 357/51; 357/15; 307/296.2
[58] Field of Search .............. 307/296.2, 296.4, 296.6; 357/46, 51, 15

[56] References Cited

U.S. PATENT DOCUMENTS 3,423,647  1/1969  Kurosawa et al. .................. 357/64
4,082,571  4/1978  Grant et al. ............................ 357/92

FOREIGN PATENT DOCUMENTS 1564169  1/1970  Fed. Rep. of Germany .
1442009  5/1966  France .
2301923  9/1976  France .

OTHER PUBLICATIONS

Bertotti et al, "New Voltage . . . Field", *IEEE Trans. Consum. Elect.*, vol. CE-24, No. 1, Feb. 78.

Primary Examiner—Andrew J. James
Assistant Examiner—Jerome Jackson, Jr.
Attorney, Agent, or Firm—Michael J. Striker

[57] ABSTRACT

A semiconductor means is integrated monolithically on a substrate and comprises at least one power diode (3), its cathode being at a higher potential (6) than the potential (5) of the substrate. Its anode forms the emitter and its cathode forms the base of a parasitic substrate transistor (4). In order to reduce the power loss caused by means of this parasitic substrate transistor (4), means (8) for increasing the collector path resistance (41) of the parasitic transistor (4) are provided.

10 Claims, 2 Drawing Sheets

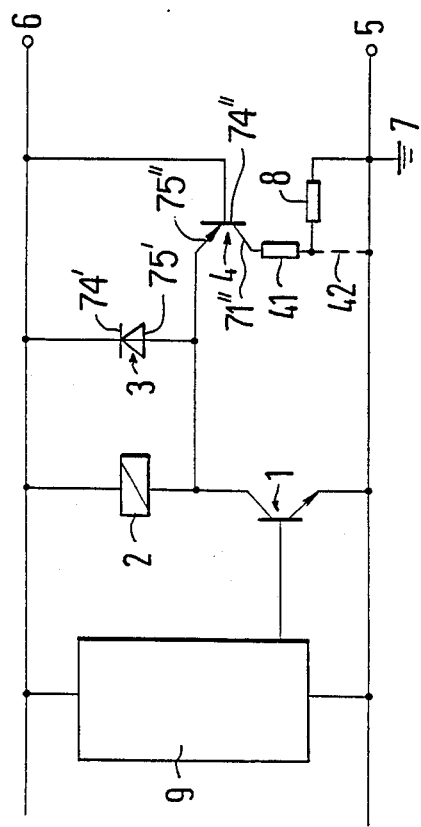
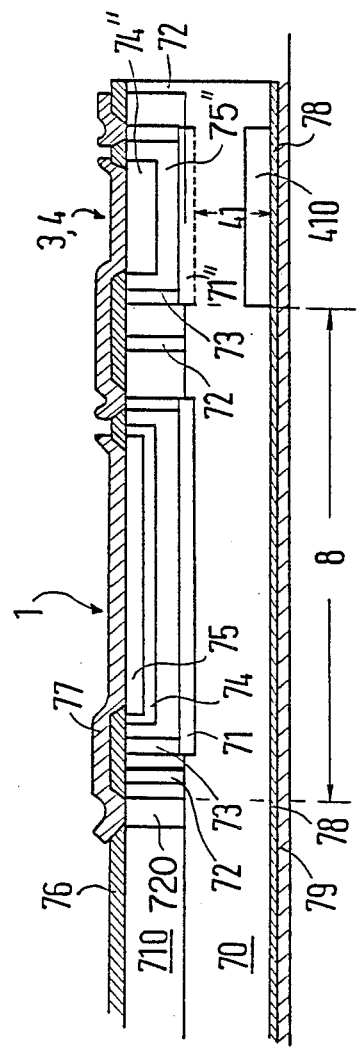

MONOLITHIC INTEGRATED SEMICONDUCTOR MEANS TO REDUCE POWER DISSIPATION OF A PARASITIC TRANSISTOR

BACKGROUND OF THE INVENTION

The invention is based on monolithic integrated semiconductor arrangement of the type having a power diode whose anode forms an emitter and whose cathode forms a base of a parasitic substrate transistor.

Such monolithic integrated semiconductor means are well-known, particularly with respect to integrated ignition output stages of internal combustion engines and output stages of electrical generator controlling means. In order to connect the current and the voltage to inductive loads, thyristors and recovery diodes are connected in parallel with the inductive load. In monolithic integrated circuits, these power component parts form a parasitic transistor toward the substrate, which parasitic transistor allows an additional substrate current to flow. However, because of technical measures relating to manufacture the current gain of this parasitic transistor can only be adjusted to typically small values between 0.05 and 0.15. For the recovery diode of a conventional three-phase generator, which can only absorb currents of up to 5 amperes, this means a parasitic substrate current between approximately 0.25 amperes and 0.75 amperes.

In a generator with a nominal rating of 14 volts, for example, a light dynamo in a motor vehicle, this means an additional power loss of between 3.5 watts and 10.5 watts.

SUMMARY OF THE INVENTION

In contrast, the monolithic integrated semiconductor means, according to the invention, has the advantage that the power loss known from the prior art, which is caused by parasitic substrate currents, can be significantly reduced. This is achieved by means of increasing the collector path resistance of the parasitic transistor, which can accordingly reach saturation.

Particularly advantageous steps for increasing the collector path resistance of the parasitic transistor can include the doping of the substrate by means of suitable doping substances. This can be carried out from the back side of the substrate. Another advantageous possibility for increasing the collector path resistance is achieved in that the substrate region located below the parasitic transistor is isolated from the conductor which is at the substrate potential whereby an additional horizontal substrate path resistance is added to the collector path resistance. In substrates with back metallization, this can already be achieved by making use of the current blocking effect of a metal semiconductor blocking or barrier layer. However, this can also be achieved by means of applying an isolation layer prior to the application of the back metallization by means of oxidizing or nitriding the back side of the substrate.

An example of an embodiment of the invention is shown in the drawing and explained in more detail in the following description.

BRIEF DESCRIPTION OF THE DRAWING

FIG. 1 shows a schematic circuit diagram of a power output stage for the connection of an inductive load;

FIG. 2 shows a cross section of a part of its structure in the form of a monolithic integrated semiconductor device.

DESCRIPTION OF THE PREFERRED EMBODIMENT

Figure 3:
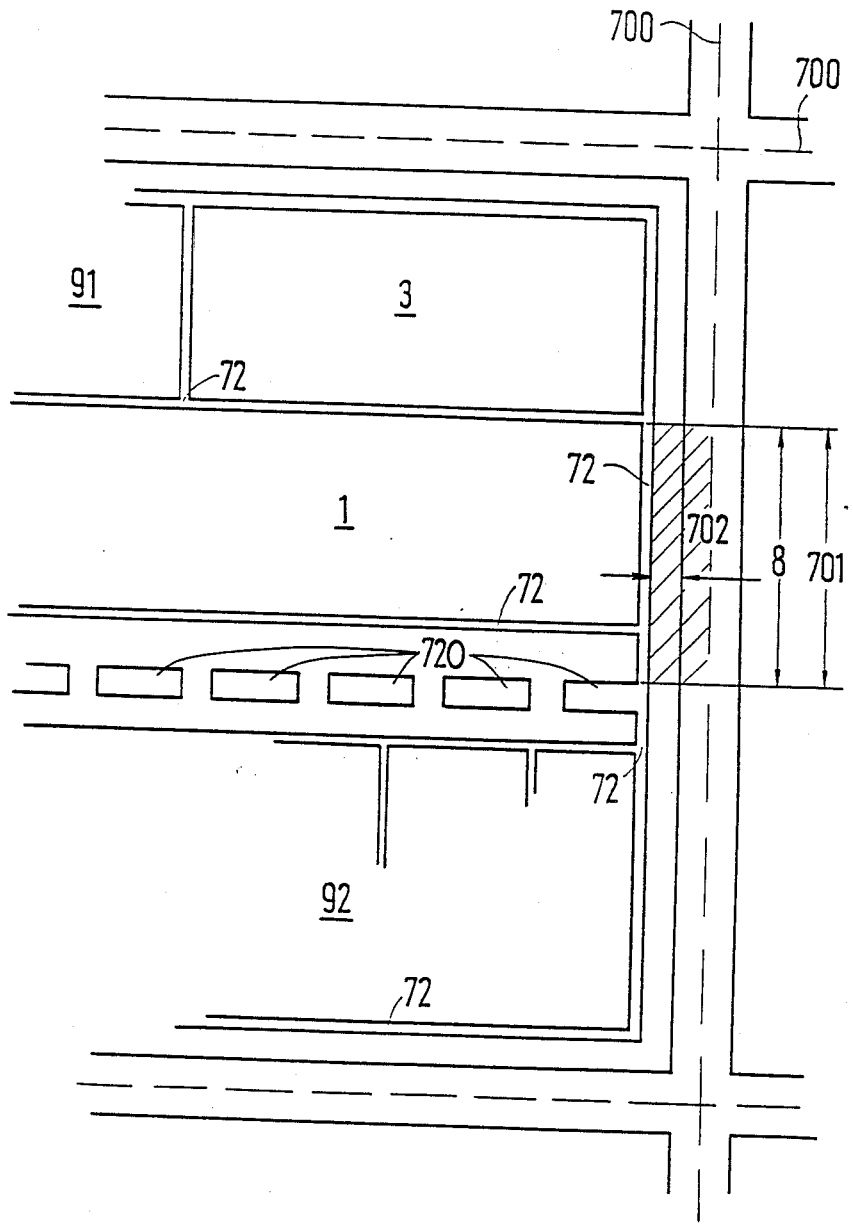
FIG. 3 shows a top view of the structure of FIG. 2.

In FIG. 1 a n-p-n power transistor 1 is connected to an inductive load 2 by its collector, a recovery power diode 3 being connected in parallel with the inductive load 2. The recovery diode 3 simultaneously forms the emitter-base diode of a parasitic transistor 4 whose collector is connected to a substrate connection 42 via a collector path resistor 41. A first supply voltage terminal 5 is connected to the emitter of the power transistor 1, and a second supply voltage terminal 6 is connected to the inductive load 2 and to the cathode of the diode 3. The potential at the supply voltage terminal 5 corresponds to the ground potential 7 of the circuit arrangement. An additional substrate resistor 8 is connected in parallel with the interrupted substrate connection 42 as it will be explained later. The entire circuit arrangement is operated by a control circuit 9 which controls the base of the output-stage transistor 1.

The operation of the control circuit 9 is unimportant for understanding the circuit of this invention and is therefore not explained in more detail for the sake of simplifying the description.

FIG. 2 shows a section through the monolithic integrated circuit according to FIG. 1, wherein the substrate is designated by 70 and an epitaxy, which is deposited on the latter, is designated by 710. The output-stage transistor 1 can be seen in the middle of FIG. 2. The recovery diode 3 and the parasitic transistor 4 whose emitter 75″ is formed by the anode 75′ of diode 3, base 74″ by the cathode 74′ of the diode 3, and parasitic collector 71″ is formed by the substrate 70, can be seen at the right-hand border. The output-stage transistor 1 is constructed as a vertical transistor with a buried collector layer 71. An isolation diffusion zone 720 simultaneously forms a connection for the substrate potential. Additional isolation diffusions 72 surrounding the diode 3 form a shunt to the substrate. The collector is designated by 73, the base is designated by 74, and the emitter of the output-stage transistor 1 is designated by 75. The shown monolithic integrated circuit is coated in a known manner with an oxide layer 76 serving as an isolation layer; a metallic connection 77 serves for applying a ground potential to the emitter of the output stage transistor 1 and, via the isolation diffusion zone 720, to the substrate. The back side of the portion of the substrate that is shown is coated with an isolation layer 78, upon which is placed a back metallization 79.

The recovery diode 3 is formed on the substrate with the output-stage transistor 1 in the same production process. 1. A resistance diffusion 410 is provided below the recovery diode 3 at the back side of the substrate.

The collector path resistor 41 shown in FIG. 1 is also indicated by arrows in FIG. 2, as it would be according to the prior art if there were no resistance diffusion 410 or isolation layer 78. Accordingly, the substrate connection 42 is also shown in FIG. 1 as being interrupted by the elements 410 or 78, so that the collector current of the parasitic transistor 4 must flow through the additionally formed substrate resistor 8, by means of which the collector current is decreased and the parasitic transistor 4 is brought to saturation. In this instance, the collector current flows from the anode of the recovery diode 3 or the emitter of the parasitic transistor 4 and from the collector along a substrate segment 8' indicated by arrow, which is located below the output-stage transistor 1 and by means of which the additional substrate resistance 8 is formed, to the insulation diffusion zone 720 serving as the substrate potential connection.

The isolation layer 78 shown in FIG. 2 can be dispensed with if no great demands are placed on the isolating action. In this case, the blocking junction between the semiconductor substrate 70 and the metallization 79 can then be used as the insulation. The resistance diffusion 410 additionally increases the collector path resistance, since doping substances are introduced from the back side of the substrate which neutralize or compensate carriers and lower the carrier life. It is also possible to dispense with the additional collector path resistor 8 and to use only the additional resistance diffusion 410.

In the top view of the monolithic integrated circuit shown in FIG. 3 the separating lines located in the center of the score frame are designated by 700, the individual chips being broken from the wafer at these separating lines 700 after the end of the diffusion processes. The area of the output-stage transistor is designated by 1, the area of the recovery diode is designated by 3. The control circuit is divided into a portion 91, which is insensitive to an increase of the substrate potential and can therefore be arranged immediately adjacent to the recovery diode 3, and a portion 92 on the other side of the isolation diffusions 720 acting as barriers. The portion of the additional isolation diffusion 72 extending in a portion 701 forms a shunt to the substrate; it is therefore constructed so as to be as narrow as possible. In addition, the outer chip border 702 should be kept free of doping substances at least along the length of the portion 701. Otherwise, these doping substances could lower the substrate resistance or even make the barriers formed by the insulating diffusions 720 at least partly ineffective.

We claim:

1. Monolithic integrated semiconductor arrangement including a substrate, an epitaxial layer deposited on one side of the substrate, at least one power diode having an anode and a cathode formed in said epitaxial layer, a first and a second conductor provided on said epitaxial layer, each of the conductors being connected to a different potential when the arrangement is in operation, and the first conductor contacting the cathode, a parasitic transistor whose emitter and base are formed, respectively, by the anode and the cathode of the power diode, and whose collector is formed by the substrate, and a collector path resistance formed by a first part of the substrate below the power diode, said arrangement comprising an isolation diffusion zone formed in said epitaxial layer and connecting said second conductor with said substrate at a connection region remote from said power diode, a second part of the substrate which extends between said connection region and said first substrate part forming an additional collector path resistance laterally connected in series with the first mentioned collector path resistance to reduce collector current flowing through said parasitic transistor.

2. Monolithic integrated semiconductor arrangement as defined in claim 1 wherein said first and second conductors are metallizations connected to power supply terminals.

3. Monolithic integrated semiconductor arrangement as defined in claim 2 wherein said second conductor is connected to a ground terminal.

4. Monolithic integrated semiconductor arrangement including a substrate, an epitaxial layer deposited on one side of the substrate, at least one power diode having an anode and a cathode formed in said epitaxial layer, a first conductor provided on said epitaxial layer in contact with the cathode, a second conductor provided on the opposite side of the substrate and having a different potential than the first conductor when the arrangement is in operation, a parasitic transistor whose emitter and base are formed, respectively, by the anode and the cathode of the power diode, and whose collector is formed by the substrate, and a collector path resistance formed by a first part of the substrate below the power diode, said arrangement comprising an isolation layer extending on a surface portion of said opposite side below said first substrate part and below a second substrate part which laterally adjoins the first substrate part and forms therewith a laterally extended collector path resistance for reducing collector current flowing through said parasitic transistor.

5. Monolithic integrated semiconductor arrangement as defined in claim 4 wherein said first and second conductors are metallizations connected to power supply terminals.

6. Monolithic integrated semiconductor arrangement as defined in claim 5 wherein said second conductor is connected to a ground terminal.

7. Monolithic integrated semiconductor arrangement as defined in claim 6 wherein said isolation layer is formed by a blocking junction between said substrate and the metallization of said first conductor.

8. Monolithic integrated semiconductor arrangement as defined in claim 4 wherein said isolation layer is an oxide layer.

9. Monolithic integrated semiconductor arrangement as defined in claim 1 wherein said first part of the substrate adjoins a boundary region of said substrate, and said boundary region being free of electrical resistance reducing substances.

10. Monolithic integrated semiconductor arrangement as defined in claim 1 further comprising at least one power transistor formed in said epitaxial layer in the area of said second substrate part, said power transistor having an emitter connected to said second conductor, a base controlled by a control device, and a collector connected to said first conductor via a load.

* * * * *